(12) United States Patent
Cheon

(10) Patent No.: US 6,313,990 B1
(45) Date of Patent: Nov. 6, 2001

(54) COOLING APPARATUS FOR ELECTRONIC DEVICES

(76) Inventor: Kioan Cheon, 33531 7th Pl. SW., Federal Way, WA (US) 98023

( * ) Notice: Subject to any disclaimer, the term of this patent is extended or adjusted under 35 U.S.C. 154(b) by 0 days.

(21) Appl. No.: 09/579,282

(22) Filed: May 25, 2000

(51) Int. Cl.$^7$ ....................................................... H05K 7/20
(52) U.S. Cl. .................... 361/699; 165/104.33; 257/714; 361/707
(58) Field of Search .................................... 361/704, 707, 361/687, 699, 700, 717–719, 695–698; 165/80.4, 104.33, 121; 257/722, 714; 62/259.2, 418; 454/184

(56) References Cited

U.S. PATENT DOCUMENTS

| | | |
|---|---|---|
| 3,788,393 * | 1/1974 | Plizak . |
| 4,204,246 * | 5/1980 | Arii . |
| 4,315,300 | 2/1982 | Parmerlee et al. .................... 361/382 |
| 4,341,432 * | 7/1982 | Cutchaw . |
| 4,434,625 | 3/1984 | Cree ......................................... 62/199 |
| 4,535,386 | 8/1985 | Frey, Jr. et al. ..................... 361/389 |
| 4,643,245 | 2/1987 | Smoot, III et al. ..................... 165/47 |
| 4,644,443 | 2/1987 | Swensen et al. ..................... 361/384 |
| 4,739,445 | 4/1988 | Tragen ................................. 361/384 |
| 4,866,743 | 9/1989 | Kroener ................................... 378/4 |
| 5,186,605 | 2/1993 | Tracy ................................... 415/119 |
| 5,195,576 | 3/1993 | Hatada et al. ........................ 165/80.3 |
| 5,203,399 * | 4/1993 | Koizumi . |
| 5,243,493 | 9/1993 | Jeng et al. ............................ 361/690 |
| 5,271,239 | 12/1993 | Rockenfeller et al. .............. 62/259.2 |
| 5,272,599 | 12/1993 | Koenen ................................. 361/710 |
| 5,285,347 | 2/1994 | Fox et al. ............................. 361/385 |
| 5,287,244 | 2/1994 | Hileman et al. ...................... 361/687 |
| 5,315,480 | 5/1994 | Samarov et al. ..................... 361/705 |
| 5,339,214 | 8/1994 | Nelson ................................. 361/695 |
| 5,370,178 | 12/1994 | Agonafer et al. ..................... 165/137 |
| 5,396,775 | 3/1995 | Rockenfeller et al. ................ 62/112 |
| 5,452,362 | 9/1995 | Burward-Hoy ......................... 381/71 |
| 5,457,342 | 10/1995 | Herbst, II ............................. 257/712 |
| 5,473,508 | 12/1995 | Porter et al. ......................... 361/695 |
| 5,482,113 | 1/1996 | Agonafer et al. ..................... 165/137 |
| 5,559,673 * | 9/1996 | Gagnon . |
| 5,596,483 * | 1/1997 | Wyler . |
| 5,731,954 | 3/1998 | Cheon ................................. 361/699 |
| 5,823,005 * | 10/1998 | Alexander . |
| 5,964,279 * | 10/1999 | Mochizuki . |
| 6,125,035 * | 9/2000 | Hood, III . |
| 6,166,907 * | 12/2000 | Chien . |

* cited by examiner

Primary Examiner—Gerald Tolin
(74) Attorney, Agent, or Firm—Joan H. Pauly (57) ABSTRACT

Cooling apparatus for computers and other electronic devices includes a heat transfer device having a passageway through which a liquid coolant circulates. The coolant circulates from the heat transfer device to a heat dissipation device and back. The heat dissipation device has a reservoir with fins positioned thereon. A fan directs ambient air through the fins to dissipate heat from the liquid coolant. The fan and fins are separated from the interior space of the computer by walls to isolate the heat-producing components from flow of ambient air.

17 Claims, 5 Drawing Sheets

COOLING APPARATUS FOR ELECTRONIC DEVICES

TECHNICAL FIELD

This invention relates to cooling apparatus for electronic devices and, more particularly, to a cooling system having a heat transfer device contacting a heat-producing component and communicating with a liquid coolant reservoir via first and second conduits, heat transfer fins mounted on the reservoir, and a fan positioned to direct ambient air through the fins, said fan and said fins being isolated from the heat-producing component to isolate the component from flow of ambient air.

BACKGROUND OF THE INVENTION

It is well known that computers and other electronic devices commonly include components that produce heat. Various types of cooling systems have been proposed for removing heat from the heat-producing components to maintain the electronic device within operating temperature limits. Known systems include passive cooling systems and systems that employ gaseous and/or liquid coolants actively brought into heat transfer contact with the heat-producing components. There are a number of drawbacks associated with the presently known systems. These include noise and dust and contamination of the electronic components associated with systems having fans to create an air stream for cooling electronic components or other elements (e.g., radiators) of the cooling system. They also include lack of sufficient cooling capacity or bulkiness and/or complexity resulting from efforts to increase cooling capacity. The principal object of the present invention is to provide a cooling system that avoids the drawbacks discussed above and is especially appropriate for use with small computers, including personal computers, work stations, servers, and small main frames.

BRIEF SUMMARY OF THE INVENTION

The present invention provides a cooling system for an electronic device having a housing defining an interior space and at least one heat-producing component mounted inside the housing in the interior space. According to an aspect of the invention, the system comprises a heat transfer device having an internal passageway extending between an inlet port and an outlet port. The passageway is in heat exchanging contact with the heat-producing component. A heat dissipation device has a casing defining a reservoir for a liquid coolant. The casing has portions made from a heat conducting material, an inlet opening, and an outlet opening spaced from the inlet opening. A plurality of heat transfer fins are mounted on and are in heat exchanging contact with an outside surface of the heat conducting portions of the casing. A first conduit extends between the outlet port of the heat transfer device and the inlet opening of the casing. A second conduit extends between the outlet opening of the casing and the inlet port of the heat transfer device. A fan is positioned adjacent to an end of the heat dissipation device and the fins. The fan is in communication with ambient air to direct ambient air through the fins to dissipate heat from liquid coolant in the reservoir. The system has walls separating the fan and the fins from the interior space of the device housing to isolate the heat-producing component from flow of ambient air.

The system preferably also includes a pump. The pump is positioned to pump liquid coolant out of the reservoir through the outlet opening, through the second conduit, the passageway, and the first conduit, and back into the reservoir through the inlet opening.

The system may be used with various types of electronic devices, including various types of computers. A first embodiment of the invention is designed for use with a personal computer. The housing is a tower case having a bottom wall. The system includes a subhousing mounted on the bottom wall. The heat dissipation device and the fan are mounted in the subhousing. This system configuration has the advantage of being readily incorporated into any computer mounted in a tower case. The system may be incorporated initially as part of the design of the computer, or also may be added as a retrofit. The system leaves the footprint of the tower case unchanged and alters the space occupied by the tower case only a small amount that results from the increase in height caused by the presence of the subhousing.

A second embodiment of the invention is designed for use in industrial computers of a type having a housing in the form of a rack mount case. The case has a first set of vent openings extending through a side wall thereof, and a second set of vent openings extending through a side wall thereof, spaced from the first set. The heat dissipation device has opposite ends positioned adjacent to the first and second sets of vent openings, respectively. In this embodiment of the invention, the system is easily adapted to a rack mount configuration. Positioning the vent openings through side walls avoids any problem of air flow being blocked by vertically adjacent devices on a multi-tiered rack. The versatility of this embodiment is further increased by the fact that the first and second sets of vent openings may be placed at various locations on the case side walls. The two sets of vent openings may extend through opposite side walls or through side walls that are perpendicular to each other.

The system also may be used to cool one or more heat-producing components and to cool various types of heat-producing components. For example, the system may be used to cool a power supply having a plurality of heat-producing elements. In such case, the system preferably includes a heat sink on which the heat-producing elements are mounted and which defines a pair of opposite channels. The passageway is formed by a U-shaped conduit that has opposite legs extending through the channels, respectively, in heat exchanging contact with the heat sink. The U-shaped conduit defines the inlet port and the outlet port.

Another embodiment of the heat transfer device comprises a cooling plate having a first wall in heat exchanging contact with a complementary surface of the heat-producing component. A second wall of the cooling plate is contoured to form, with portions of the first wall, the passageway.

Another embodiment of the heat transfer device comprises a cooling plate having an inner face along which a serpentine channel extends. The face is secured in liquid tight engagement with a surface of the heat-producing component. The passageway is defined by the channel and the surface. Liquid coolant circulating through the passageway is in direct contact with the surface.

In systems having heat transfer devices with the characteristics last described, the heat-producing component preferably includes an outer plate portion having a plurality of openings extending therethrough. An outer surface of the outer plate portion forms the surface of the heat-producing component that is in engagement with the inner face of the cooling plate. The cooling plate is secured to the outer plate portion, to secure the face in liquid tight engagement with the outer surface, by a plurality of fasteners extending through the openings through the outer plate portion, respectively, and corresponding openings in the cooling plate. The cooling plate has a plurality of projections, one for each opening in the outer plate portion, extending into the openings in the outer plate portion to inhibit lateral movement of the cooling plate relative to the outer plate portion. This arrangement provides a relatively inexpensive mounting for the cooling plate that is strong and reliable.

The invention also provides a computer into which cooling apparatus is incorporated. According to an aspect of the invention, the computer comprises a housing defining an inner space, at least one heat-producing component mounted inside the housing in the interior space, and cooling apparatus as described above. The computer may also include one or more of the preferred or alternative features described above.

The invention also provides cooling apparatus for a power supply of an electronic device, said power supply having a plurality of heat-producing elements. According to an aspect of the invention, the cooling apparatus comprises the heat sink and U-shaped conduit described above.

A further apparatus provided by the invention is a heat transfer device for a heat-producing component of an electronic device. According to an aspect of the invention, the heat transfer device comprises a cooling plate secured to provide direct contact between liquid coolant and a surface of the heat-producing component, as described above. Preferably, the device is mounted in the manner described above by fasteners extending through corresponding openings in the cooling plate and an outer plate portion of the component.

The invention provides a cooling system and cooling devices that avoid the drawbacks of known cooling systems discussed above and at the same time achieve efficient, effective, and reliable cooling of electronic devices and heat-producing components thereof. In the system of the invention, the combination of the use of a liquid coolant in a heat transfer device or devices, active cooling of the liquid coolant by ambient air flow, and isolation of the flow of ambient air results in efficient cooling of the heat-producing components while protecting the components from contamination that could result from contact with flow of ambient air. The system permits a level of efficiency that allows fans to be operated at full power or at a level less than full power. Operation at lower powers allows the system to be operated relatively noiselessly. The apparatus of the invention is relatively simple in construction and readily adaptable to various types of computers and other electronic devices. Thus, use of the apparatus is highly cost effective.

These and other advantages and features of the invention will become apparent from the detailed description of the invention that follows.

BRIEF DESCRIPTION OF THE DRAWINGS

In the drawings, like element designations refer to like parts throughout, and.

DETAILED DESCRIPTION OF THE INVENTION

Figure 1A:
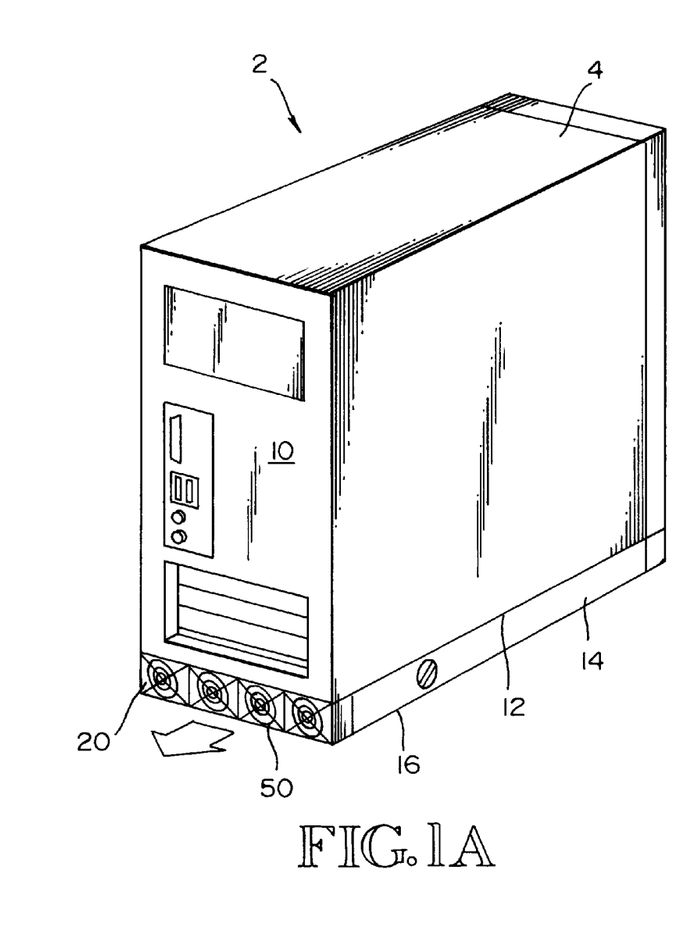
FIG. 1A is a pictorial view looking toward the back and one side of the tower case of a personal computer equipped with cooling apparatus in accordance with the invention.
Figure 1B:
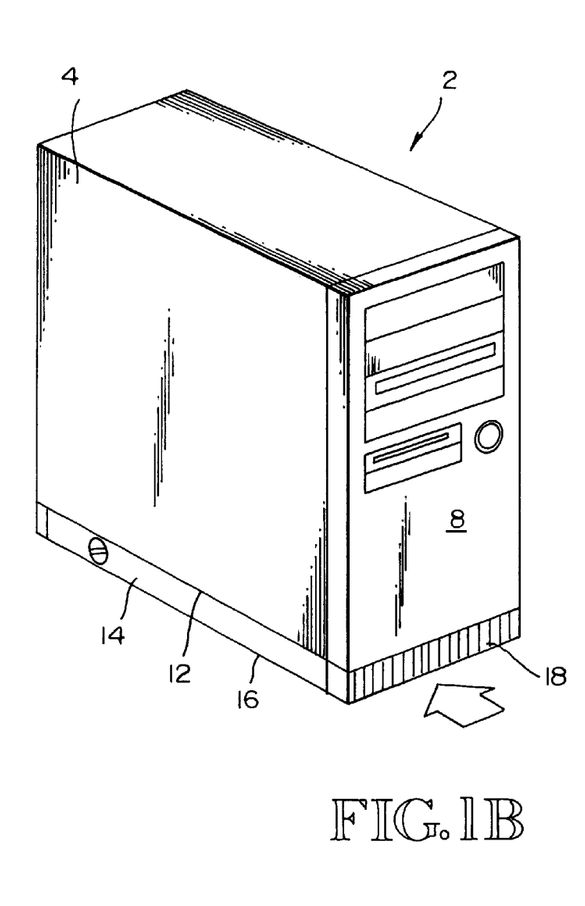
FIG. 1B is like FIG. 1A except that it looks toward the front of the tower case.
Figure 2:
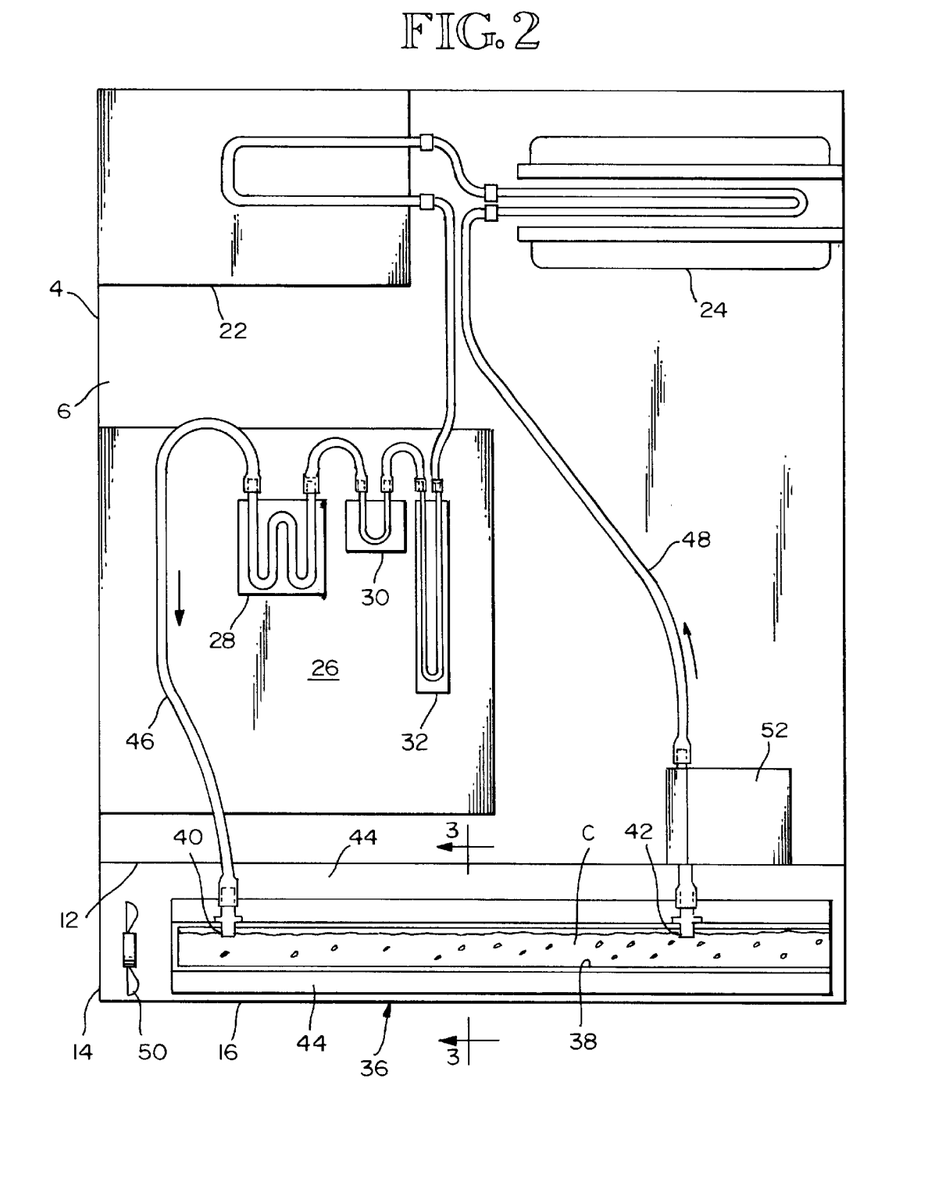
FIG. 2 is a partially schematic view of the personal computer shown in FIGS. 1A and 1B illustrating the components mounted in the tower case and the cooling apparatus mounted in the subhousing at the bottom of the case.
Figure 12:
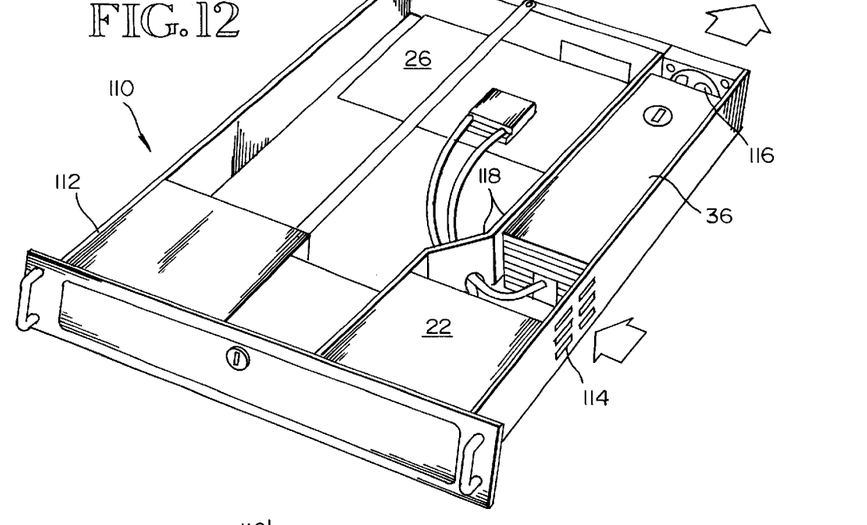
FIG. 12 is a pictorial view of an industrial personal computer incorporating cooling apparatus constructed in accordance with the invention.
Figure 13:
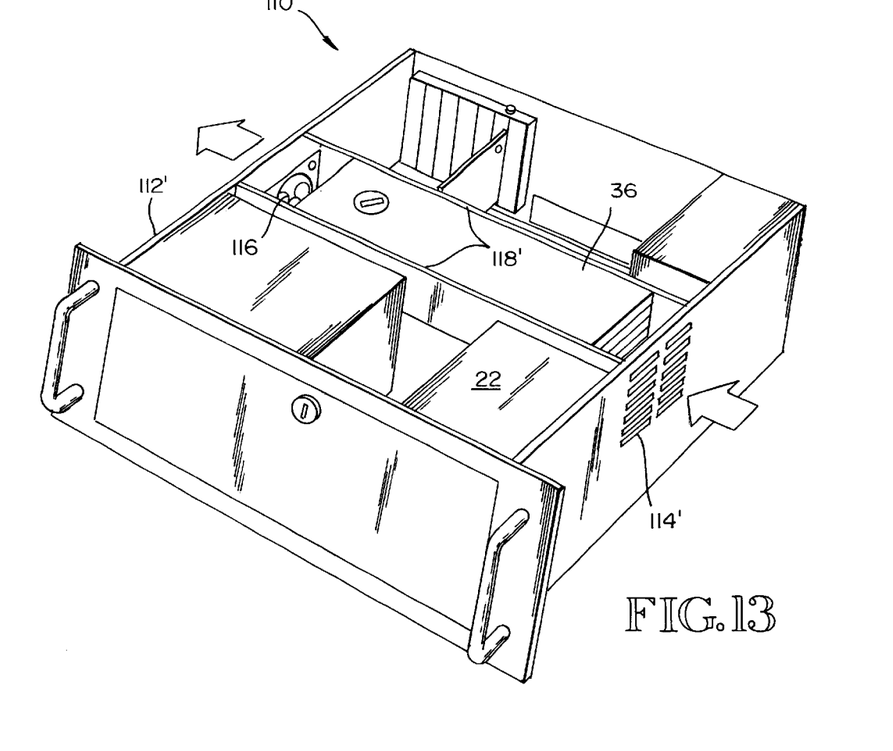
FIG. 13 is similar to FIG. 12 but shows the cooling apparatus at a different location in the computer case.

The drawings show embodiments of the apparatus of the invention that are constructed in accordance with the invention and together constitute the best modes of carrying out the invention currently known to the applicant. The cooling apparatus of the invention may be used in various types of electronic devices. FIGS. 1 and 2 illustrate use in a common type of personal computer. FIGS. 12 and 13 illustrate use in two types of rack mount industrial personal computers. It is anticipated that the illustrated uses will be the primary uses of the apparatus of the invention. However, it is intended to be understood that the cooling apparatus of the invention may also be used with other types of electronic devices.

Referring to FIGS. 1A, 1B, and 2, the personal computer (PC) 2 illustrated therein has a housing in the form of a tower case 4. The case 4 defines an interior space 6. A number of components are mounted inside the case 4 in the space 6. These components are of various types and include a number of heat-producing components. Referring specifically to FIGS. 1A and 1B, the case 4 has a front 8, an opposite back 10, and a lower bottom wall 12. In accordance with the invention, a subhousing 14 is mounted on the bottom 12 of the case 4. The subhousing 14 itself has a bottom wall 16. Air intake vents 18 are formed on the front end of the subhousing 14, and an air outlet 20 is formed on the opposite rear end.

Referring to FIG. 2, the components mounted inside the case 4 include a power supply 22 and a hard drive 24. A mother board 26 is also mounted inside the case 4. As is well-known, a mother board commonly has a number of components mounted thereon. In the simplified illustrated PC 2, three components are shown mounted on the mother board 26. These components are a CPU 28, a microprocessor chip 30, and memory 32. Each of these three components 28, 30, 32, the power supply 22, and the hard drive 24 are heat-producing components. Therefore, they are provided with cooling apparatus in accordance with the invention, as described further below.

In accordance with the invention, each of the heat-producing components is provided with a heat transfer device having an internal passageway extending between an inlet port and an outlet port. The passageway is in heat exchanging contact with the heat-producing component. Liquid coolant C circulates through the passageway to carry heat away from the component.

Figures 3, 5, 6, 7, 8:
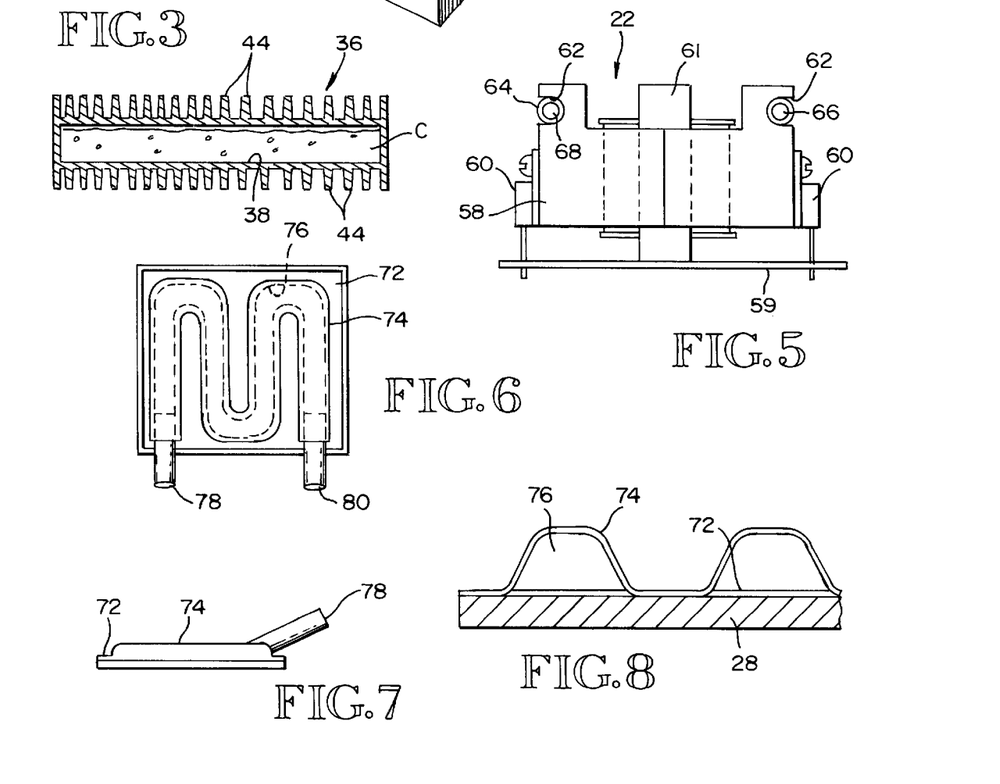
FIG. 3 is a sectional view taken along the line 3—3 in FIG. 2.
FIG. 5 is an elevational view of the power supply shown in FIG. 4.
FIG. 6 is a top plan view of another embodiment of the heat transfer device of the invention.
FIG. 7 is an elevational view of the device shown in FIG. 6.
FIG. 8 is a fragmentary sectional view of the device shown in FIGS. 6 and 7.

The cooling apparatus of the invention also includes a heat dissipation device 36, best seen in FIGS. 2 and 3. The heat dissipation device 36 is mounted in the subhousing 14 and has a casing that defines a reservoir 38 for the liquid coolant C. The casing has portions made from a heat conducting material, an inlet opening 40, and an outlet opening 42 spaced from the inlet opening 40. A plurality of heat transfer fins 44 are mounted on and are in heat exchanging contact with an outside surface of the heat conducting portions of the casing. Liquid coolant C is circulated from the reservoir 38 to the heat transfer devices on the heat-producing components and back to the reservoir 38. A first conduit 46 extends from the outlet port of a heat transfer device and the inlet opening 40 of the reservoir 38. A second conduit 48 extends between the outlet opening 42 of the reservoir 38 and the inlet port of a heat transfer device. As shown, the coolant C circulates through the passageways of the various heat transfer devices for the heat-producing components in series. Coolant C from the reservoir 38 moves through conduit 48 into the heat transfer device for the hard drive 24 and out of the heat transfer device and into the heat transfer device for the power supply 22. From the power supply 22, the coolant C circulates consecutively through the heat transfer devices for the memory 32, microprocessor chip 30, and CPU 28. From the outlet port of the heat transfer device for the CPU 28, the coolant C circulates back through the conduit 46 and into the reservoir 38 through the inlet opening 40. As shown, the cooling apparatus preferably includes a pump 52 positioned to pump the liquid coolant C out of the reservoir 38 and through the heat transfer devices, as described above.

Still referring to FIG. 2, the cooling apparatus mounted in the subhousing 14 also includes a fan 50. The fan 50 is positioned adjacent to an end of the heat dissipation device 36 and is in communication with ambient air through the adjacent outlet vent 20 of the subhousing 14. The fan 50 operates to direct ambient air through the fins 44 to dissipate heat from liquid coolant C in the reservoir 38. An important feature of the invention is isolation of the heat-producing components of the PC 2 from the flow of ambient air. To provide such isolation, the system includes a wall or walls separating the fan 50 and fins 44 from the interior space 6 defined by the PC housing 4. In the embodiment illustrated in FIGS. 1A, 1B, and 2, the bottom wall 12 of the PC tower case housing 4 functions as the separating wall.

Figure 4:
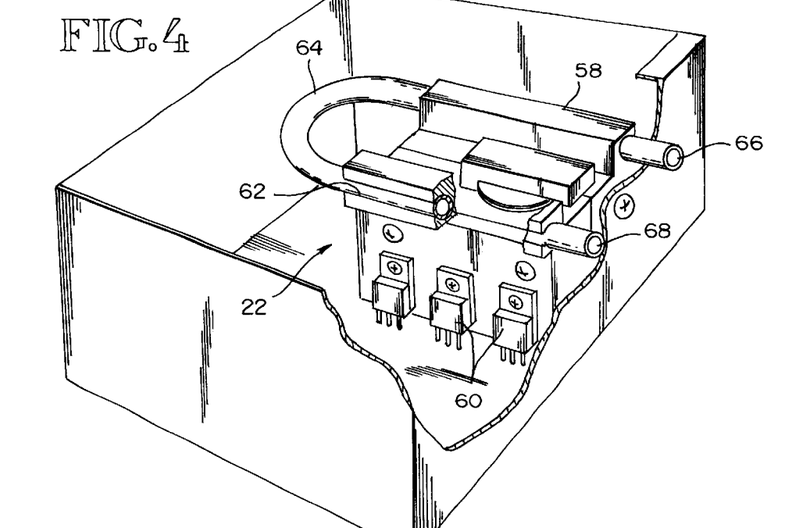
FIG. 4 is a pictorial view of a power supply and an associated heat transfer device constructed in accordance with the invention, with foreground portions cut away.

FIGS. 4 and 5 illustrate the currently preferred embodiment of the heat transfer device for cooling the power supply 22. Referring to FIGS. 4 and 5, the power supply 22 includes an integrally die cast aluminum heat sink 58. The heat sink 58 is mounted on a board 59. The power supply 22 includes a plurality of heat-producing elements 60, 61. Such elements are, for example, transistors and/or transformers. FIGS. 4 and 5 show transistors 60 and a switching transformer 61. The elements 60 are mounted on the heat sink 58 in heat exchanging contact therewith. The heat sink 58 has a pair of opposite channels 62 formed thereon. The liquid coolant circulating passageway of the illustrated heat transfer device is formed by a U-shaped conduit 64 that has opposite legs extending through the channels 62 in heat exchanging contact with the heat sink 58. The opposite ends of the conduit 64 form the inlet port 66 and the outlet port 68 of the device. Liquid coolant C circulating through the passageway picks up and carries away heat from the heat sink 58 and thereby carries away heat produced by the elements 60.

FIGS. 6–8 illustrate another embodiment of the heat transfer device. As shown, this embodiment of the heat transfer device is mounted on a CPU 28 to cool the CPU 28. The heat transfer device includes a cooling plate 72, 74 having a first wall 72 in heat exchanging contact with a complementary surface of the CPU 28. As shown, the first wall 72 and complementary surface are essentially flat. The device also includes a second wall 74 contoured to form, with portions of the first wall 72, the passageway 76 of the device. Short tubular conduits are secured to opposite ends of the passageway 76 to form the inlet port 78 and outlet port 80.

Figure 9:
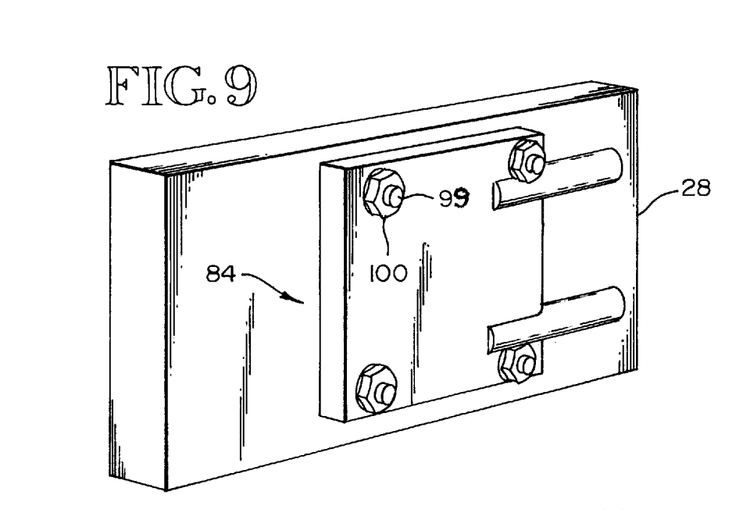
FIG. 9 is a pictorial view of another embodiment of a heat transfer device mounted on a central processing unit (CPU).
Figure 10:
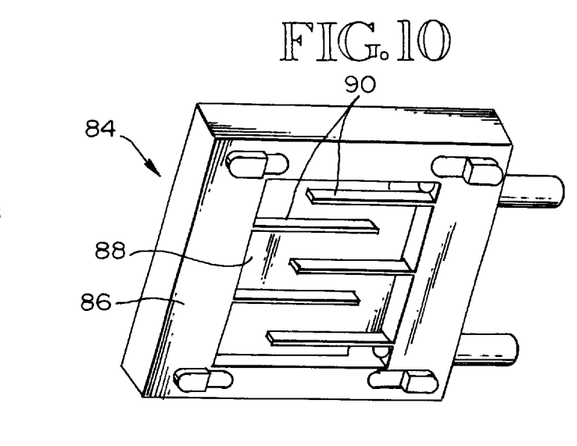
FIG. 10 is a pictorial view of the inner face of the cooling plate shown in FIG. 9.
Figure 11:
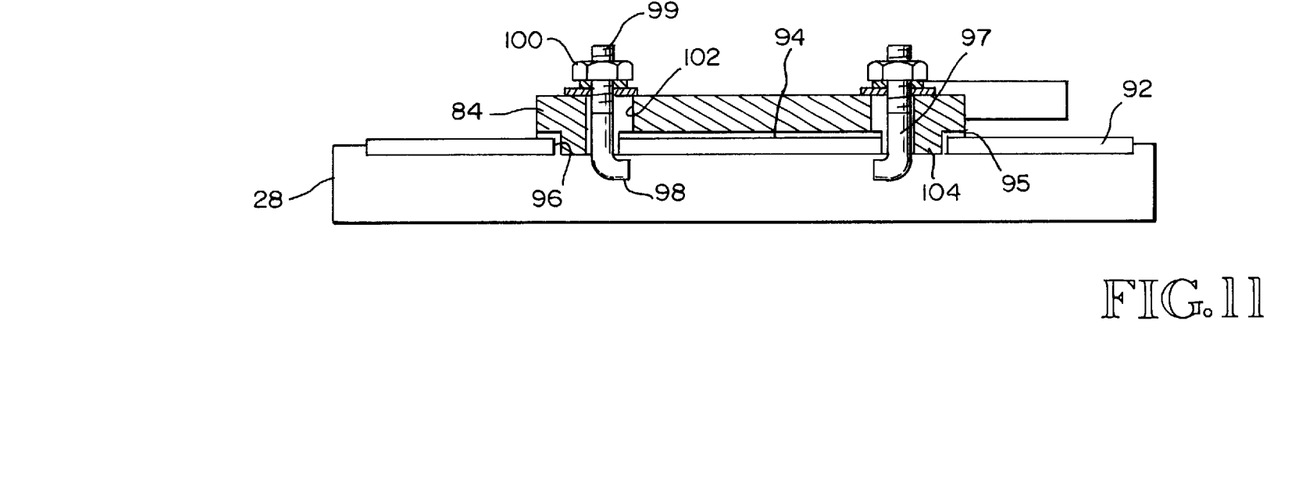
FIG. 11 is an elevational view of the cooling apparatus and CPU shown in FIG. 9, with parts shown in section.

FIGS. 9–11 illustrate a third embodiment of the heat transfer device of the invention. As shown, this embodiment of the device includes a cooling plate 84. The plate 84 has an inner face 86 along which a serpentine channel 88 extends. The channel 88 is formed by a rectangular recess in the inner face 86. The turns in the passageway are formed by divider walls 90 that extend across the recess about two-thirds of the way from one recess wall to an opposite recess wall. Adjacent divider walls 90 extend from opposite walls to create a serpentine pattern.

As shown in FIG. 11, the CPU body includes an aluminum outer plate portion 92. The inner face 86 of the cooling plate 84 is secured in liquid tight engagement with the outer surface 94 of the outer plate portion 92. Preferably, a heat pad or sealing ring 95 is positioned between the outer surface 94 and the periphery of the cooling plate 84 around the passageway-forming recess. The passageway is defined by the serpentine channel 88 formed on the face 86 of the cooling plate 84 and the outer surface 94 of the CPU outer plate portion 92. Liquid coolant C circulating through the passageway is, thus, in direct contact with the outer surface 94.

The cooling plate 84 is secured to the outer plate 92 by a plurality of fasteners 97. As shown, there are four fasteners 97 positioned at the four corners of the cooling plate 84. The fasteners 97 extend through four openings 96 extending through the outer plate portion 92. Each fastener 97 also extends through a corresponding opening 102 in the cooling plate 84. Referring to FIG. 11, each fastener has a bent end 98 that bends to engage the inner surface of the outer plate portion 92 opposite the cooling plate 84. The opposite end 99 of the fastener 97 is threaded and is threadedly engaged by a tightening nut 100. Adjacent to each opening 102 through the cooling plate 84 is a projection 104 that extends from the cooling plate 84 into the corresponding opening 96 in the outer plate portion 92. The projections 104 function to inhibit lateral movement of the cooling plate 84 relative to the outer plate portion 92. This mounting arrangement is a feature of the invention that provides an inexpensive and strong mounting of the heat transfer device.

As noted above, the cooling apparatus of the invention may be used in industrial computers of a type having a rack mount case. FIGS. 12 and 13 illustrate two industrial PC's 110, 110' into which cooling apparatus of the invention has been incorporated. Referring to FIG. 12, the industrial PC 110 shown therein has a rack mount case 112. The case 112 has a first set of vent openings 114 extending through a side wall thereof. A second set of vent openings spaced from the first set 114 extends through another side wall of the case 112. The two side walls meet at an angle and are perpendicular to each other. The opposite ends of the heat dissipation device 36 are positioned adjacent to the first and second sets of vent openings, respectively. The positioning of the vents through side walls allows the free flow of ambient air through the heat dissipation device 36 without interference from vertically adjacent cases of computers mounted on the same rack. Still referring to FIG. 12, a fan 116 is positioned adjacent to the vent openings opposite the first set of vent openings 114. Alternatively, the fan 116 itself may form the second set of vent openings. The arrows in FIG. 12 illustrate the flow of ambient air through the heat dissipation device 36. A divider wall 118 isolates the components of the computer 110 from the flow of ambient air through the heat dissipation device 36.

FIG. 13 is similar to FIG. 12 but shows a different type of rack mount industrial PC 110'. The computer 110' has a rack mount case 112'. In this computer 110', the first set of vent openings 114' and the fan 116 are located on opposite side walls of the case 114, rather than being located at intersecting side walls, as shown in FIG. 12. These two different positionings of the heat dissipation device 36 illustrate the versatility of the apparatus of the invention. In FIG. 13, opposite divider walls 118' isolate the computer components from the flow of ambient air through the heat dissipation device 36. In both FIG. 12 and FIG. 13, the fins are preferably oriented horizontally, rather than vertically as in FIGS. 2 and 3.

Although the preferred embodiments of the invention have been illustrated and described herein, it is intended to be understood by those skilled in the art that various modifications and omissions in form and detail may be made without departing from the spirit and scope of the invention as defined by the following claims.

What is claimed is:

1. A cooling system for an electronic device having a housing defining an interior space and at least one heat-producing component mounted inside the housing in said interior space, comprising:
    a heat transfer device having an internal passageway extending between an inlet port and an outlet port, said passageway being positionable in heat exchanging contact with the heat-producing component;
    a heat dissipation device having a casing defining a reservoir for a liquid coolant; said casing having portions made from a heat conducting material, an inlet opening, and an outlet opening spaced from the inlet opening;
    a plurality of heat transfer fins mounted on and in heat exchanging contact with an outside surface of said portions of said casing;
    a first conduit extending between the outlet port of said heat transfer device and the inlet opening of said casing;
    a second conduit extending between the outlet opening of said casing and the inlet port of said heat transfer device; and
    a fan positioned adjacent to an end of said heat dissipation device and said fins and in communication with ambient air to direct ambient air through said fins to dissipate heat from liquid coolant in said reservoir;
    said system having walls configured to separate said fan and said fins from said interior space to isolate the heat-producing component from flow of ambient air.

2. The system of claim 1, further comprising a pump positioned to pump liquid coolant out of said reservoir through said outlet opening, through said second conduit, said passageway, and said first conduit, and back into said reservoir through said inlet opening.

3. The system of claim 1, wherein said heat-producing component is a power supply having a plurality of heat-producing elements; and the system includes a heat sink configured to permit said elements to be mounted thereon, said heat sink defines a pair of opposite channels, and said passageway is formed by a U-shaped conduit that has opposite legs extending through said channels, respectively, in heat exchanging contact with said heat sink and that defines said inlet port and said outlet port.

4. The system of claim 1, wherein said heat transfer device comprises a cooling plate having a first wall positionable in heat exchanging contact with a complementary surface of said heat-producing component, and a second wall contoured to form, with portions of said first wall, said passageway.

5. The system of claim 1, wherein said heat transfer device comprises a cooling plate having an inner face along which a serpentine channel extends; said face being securable in liquid tight engagement with a surface of said heat-producing component, to define said passageway between said channel and said surface, and bring liquid coolant circulating through said passageway into direct contact with said surface.

6. The system of claim 5, wherein said heat-producing component includes an outer plate portion having a plurality of openings extending therethrough, said surface being an outer surface of said outer plate portion; and said cooling plate is securable to said outer plate portion, to secure said face in liquid tight engagement with said outer surface, by a plurality of fasteners extending through said openings, respectively, and corresponding openings in said cooling plate; and said cooling plate has a plurality of projections, one for each opening in said outer plate portion, extendible into said openings in said outer plate portion to inhibit lateral movement of said cooling plate relative to said outer plate portion.

7. The system of claim 1, wherein said electronic device is an industrial computer, and said housing is a rack mount case, said case having a first set of vent openings extending through a side wall thereof, and a second set of vent openings extending through a side wall thereof, spaced from said first set; and said heat dissipation device has opposite ends positionable adjacent to said first and second sets of vent openings, respectively.

8. A cooling system for an electronic device having a housing defining an interior space and at least one heat-producing component mounted inside the housing in said interior space, comprising:
    a heat transfer device having an internal passageway extending between an inlet port and an outlet port, said passageway being positionable in heat exchanging contact with the heat-producing component;
    a heat dissipation device having a casing defining a reservoir for a liquid coolant; said casing having portions made from a heat conducting material, an inlet opening, and an outlet opening spaced from the inlet opening;
    a plurality of heat transfer fins mounted on and in heat exchanging contact with an outside surface of said portions of said casing;
    a first conduit extending between the outlet port of said heat transfer device and the inlet opening of said casing;

a second conduit extending between the outlet opening of said casing and the inlet port of said heat transfer device; and a fan positioned adjacent to an end of said heat dissipation device and said fins and in communication with ambient air to direct ambient air through said fins to dissipate heat from liquid coolant in said reservoir;

said system having walls configured to separate said fan and said fins from said interior space to isolate the heat-producing component from flow of ambient air;

wherein said electronic device is a personal computer, and said housing is a tower case having a bottom wall; and said system includes a subhousing mountable on said bottom wall, said heat dissipation device and said fan being mounted in said subhousing.

9. A computer comprising:

a housing defining an interior space;

at least one heat-producing component mounted inside said housing in said interior space;

a heat transfer device having an internal passageway extending between an inlet port and an outlet port, said passageway being in heat exchanging contact with said heat-producing component;

a heat dissipation device having a casing defining a reservoir for a liquid coolant; said casing having portions made from a heat conducting material, an inlet opening, and an outlet opening spaced from the inlet opening;

a plurality of heat transfer fins mounted on and in heat exchanging contact with an outside surface of said portions of said casing;

a first conduit extending between the outlet port of said heat transfer device and the inlet opening of said casing;

a second conduit extending between the outlet opening of said casing and the inlet port of said heat transfer device; and a fan positioned adjacent to an end of said heat dissipation device and said fins and in communication with ambient air to direct ambient air through said fins to dissipate heat from liquid coolant in said reservoir;

said computer having walls separating said fan and said fins from said interior space to isolate the heat-producing component from flow of ambient air.

10. The computer of claim 9, further comprising a pump positioned to pump liquid coolant out of said reservoir through said outlet opening, through said second conduit, said passageway, and said first conduit, and back into said reservoir through said inlet opening.

11. The computer of claim 9, wherein said heat-producing component is a power supply having a plurality of heat-producing elements, the computer includes a heat sink on which said elements are mounted and which defines a pair of opposite channels, and said passageway is formed by a U-shaped conduit that has opposite legs extending through said channels, respectively, in heat exchanging contact with said heat sink and that defines said inlet port and said outlet port.

12. The computer of claim 9, wherein said heat transfer device comprises a cooling plate having a first wall in heat exchanging contact with a complementary surface of said heat-producing component, and a second wall contoured to form, with portions of said first wall, said passageway.

13. The computer of claim 9, wherein said heat transfer device comprises a cooling plate having an inner face along which a serpentine channel extends; said face being secured in liquid tight engagement with a surface of said heat-producing component, said passageway being defined by said channel and said surface, and liquid coolant circulating through said passageway being in direct contact with said surface.

14. The computer of claim 13, wherein said heat-producing component includes an outer plate portion having a plurality of openings extending therethrough; said surface being an outer surface of said outer plate portion; said cooling plate being secured to said outer plate portion, to secure said face in liquid tight engagement with said outer surface, by a plurality of fasteners extending through said openings, respectively, and corresponding openings in said cooling plate; and said cooling plate having a plurality of projections, one for each opening in said outer plate portion, extending into said openings in said outer plate portion to inhibit lateral movement of said cooling plate relative to said outer plate portion.

15. The computer of claim 9, wherein said housing is a rack mount case; said case has a first set of vent openings extending through a side wall thereof, and a second set of vent openings extending through a side wall thereof, spaced from said first set; and said heat dissipation device has opposite ends positioned adjacent to said first and second sets of vent openings, respectively.

16. A computer comprising:

a housing defining an interior space;

at least one heat-producing component mounted inside said housing in said interior space;

a heat transfer device having an internal passageway extending between an inlet port and an outlet port, said passageway being in heat exchanging contact with said heat-producing component;

a heat dissipation device having a casing defining a reservoir for a liquid coolant; said casing having portions made from a heat conducting material, an inlet opening, and an outlet opening spaced from the inlet opening;

a plurality of heat transfer fins mounted on and in heat exchanging contact with an outside surface of said portions of said casing;

a first conduit extending between the outlet port of said heat transfer device and the inlet opening of said casing;

a second conduit extending between the outlet opening of said casing and the inlet port of said heat transfer device; and a fan positioned adjacent to an end of said heat dissipation device and said fins and in communication with ambient air to direct ambient air through said fins to dissipate heat from liquid coolant in said reservoir;

said computer having walls separating said fan and said fins from said interior space to isolate the heat-producing component from flow of ambient air;

wherein said housing is a tower case having a bottom wall; and said computer includes a subhousing mounted on said bottom wall, said heat dissipation device and said fan being mounted in said subhousing.

17. A heat transfer device for a heat-producing component of an electronic device, comprising:

a cooling plate having an inner face along which a serpentine channel extends; said face being securable in liquid tight engagement with a surface of a heat-producing component; and said channel being configured to define, with the surface, when said face is secured to the surface, a passageway so that liquid coolant circulating through said passageway is in direct contact with said surface;

wherein said heat-producing component includes an outer plate portion having a plurality of openings extending therethrough, and said surface is an outer surface of said outer plate portion; and said cooling plate is securable to said outer plate portion, to secure said face in liquid tight engagement with said outer surface, by a plurality of fasteners extending through said openings, respectively, and corresponding openings in said cooling plate; and said cooling plate has a plurality of projections, one for each opening in said outer plate portion, extendible into said openings in said outer plate portion to inhibit lateral movement of said cooling plate relative to said outer plate portion.

* * * * *